United States Patent [19]

Moore et al.

[11] 3,944,860
[45] Mar. 16, 1976

[54] RADIATION-SENSITIVE SWITCHING CIRCUITS

[75] Inventors: John Howard Moore, Redditch; Charles Peter Cockshott, Coventry, both of England

[73] Assignee: The Lucas Electrical Company Limited, Birmingham, England

[22] Filed: July 3, 1974

[21] Appl. No.: 485,436

[30] Foreign Application Priority Data

July 12, 1973 United Kingdom............... 33334/73
Sept. 25, 1973 United Kingdom............... 44772/73

[52] U.S. Cl. ................................................. 307/311
[51] Int. Cl.² ..................... H03K 19/14; H03K 3/42
[58] Field of Search .................................. 307/311

[56] References Cited
UNITED STATES PATENTS

| | | | |
|---|---|---|---|
| 2,947,875 | 8/1960 | Beck | 307/311 X |
| 3,421,488 | 1/1969 | Tarter | 307/311 X |
| 3,562,534 | 2/1971 | Jarrett | 307/311 X |
| 3,622,801 | 11/1971 | Stone | 307/311 X |

Primary Examiner—John S. Heyman
Attorney, Agent, or Firm—Andrus, Sceales, Starke & Sawall

[57] ABSTRACT

A radiation-sensitive switching circuit includes a light emitting diode which from time to time illuminates a photo-transistor, the photo-transistor serving when its output reaches a predetermined value to operate a trigger circuit. In order to allow for aging of the components, the current flow through the diode is increased when the output from the transistor falls below a known level. Conveniently, this is achieved by having a transistor in parallel with the diode, and turning the transistor off when the output from the photo-transistor becomes too low.

4 Claims, 3 Drawing Figures

RADIATION-SENSITIVE SWITCHING CIRCUITS

This invention relates to radiation-sensitive switching circuits.

A circuit according to the invention comprises in combination a radiation source, a radiation-sensitive device which conducts when exposed to the radiation source, a control member positioned between the source and the device and serving to expose the device to the source at predetermined instants of time, a trigger circuit coupled to the device and producing an output when the output from the device attains a set level, and means modifying the current flow through the source in accordance with the output from the device for a known level of illumination.

Preferably, said means measures the peak output of the device, and increases the current flow through the source when the peak output falls below a set level.

Figure 1:
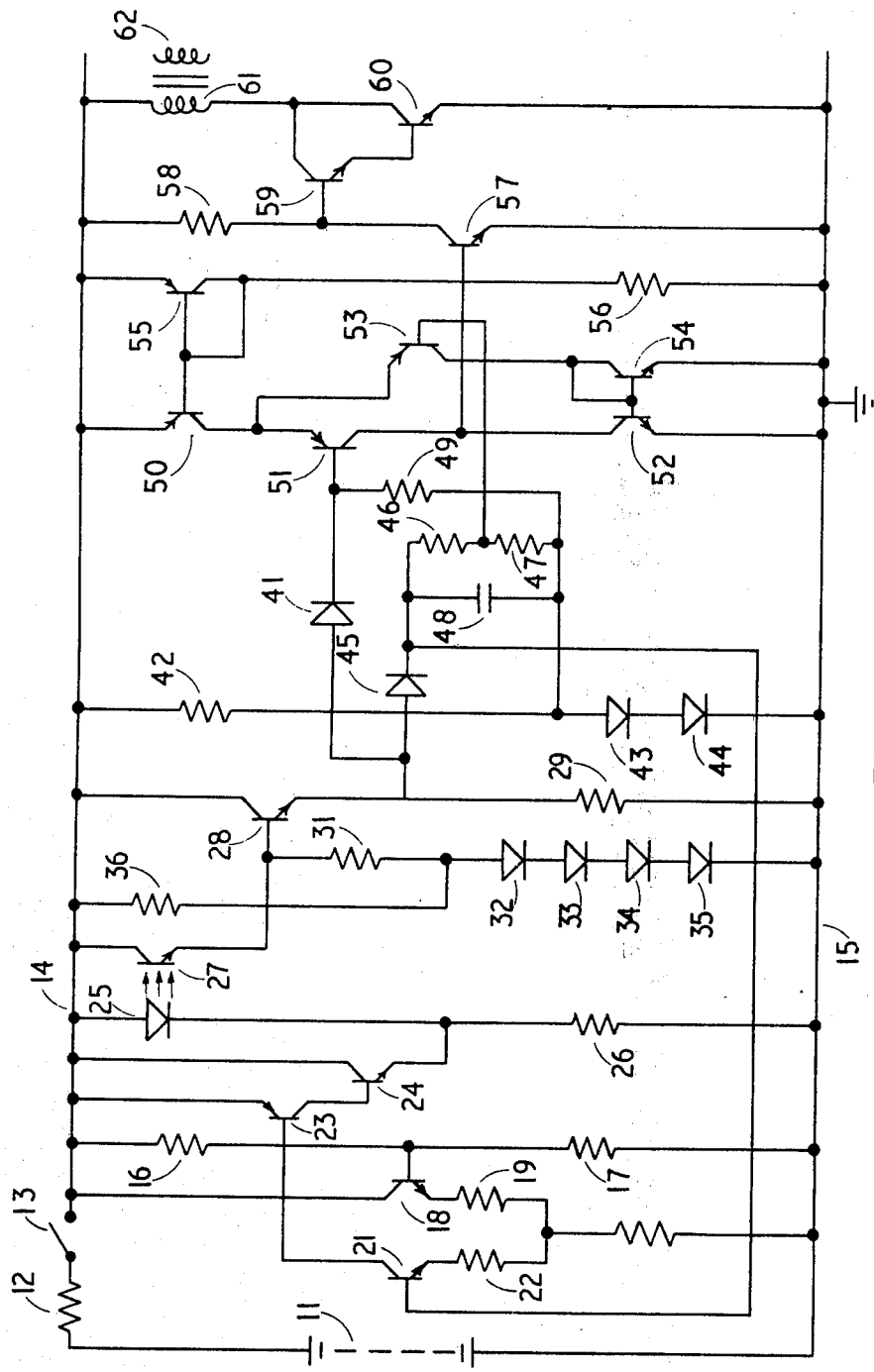
Figure 2:
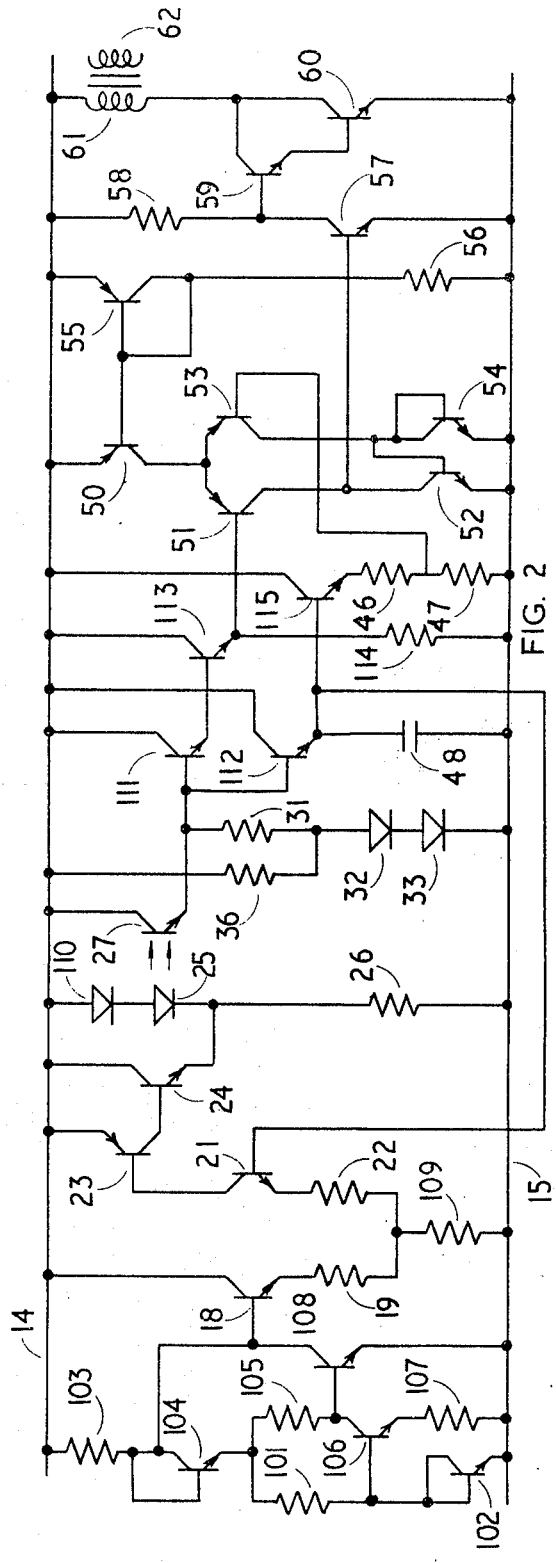
Figure 3:
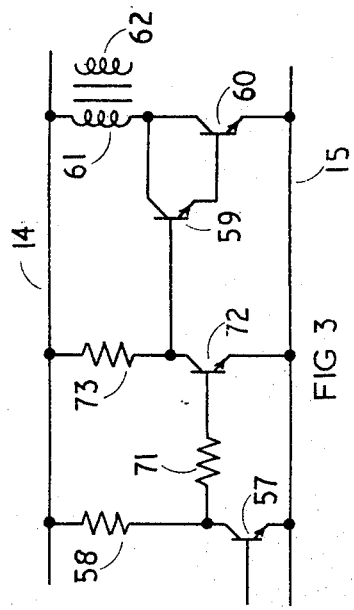

In the accompanying drawings,

FIGS. 1 and 2 are circuit diagrams illustrating two examples of the invention, and FIG. 3 illustrates a minor modification applicable to either example.

Referring to FIG. 1, a vehicle battery 11 has its positive terminal connected through a resistor 12 and the vehicle ignition switch 13 in series to a supply line 14, and its negative terminal connected to a supply line 15 which is earthed. Connected in series between lines 14, 15 are a pair of resistors 16, 17, the junction between which is connected to the base of an n-p-n transistor 18 having its collector connected to the line 14 and its emitter connected through a resistor 19 to the line 15. A further n-p-n transistor 21 is provided having its emitter connected through a resistor 22 to the line 15 and its collector connected to the base of a p-n-p transistor 23, the emitter of which is connected to the line 14 and the collector of which is connected to the base of an n-p-n transistor 24 having its emitter connected to the junction of a light emitting diode 25 and a resistor 26 connected in series between the lines 14, 15.

There is further provided a photo-transistor 27 which is positioned adjacent to the diode 25. The collector of the transistor 27 is connected to the line 14 and its emitter is connected to the base of an n-p-n transistor 28 with its collector connected to the line 14 and its emitter connected through a resistor 29 to the line 15. The base of the transistor 28 is connected to the line 15 through a resistor 31 and four diodes 32, 33, 34, 35 in series, and the junction of the resistor 31 and diode 32 is connected through a resistor 36 to the line 14.

The lines 14, 15 are bridged by a resistor 42 and a pair of diodes 43, 44 in series, and the emitter of the transistor 28 is connected to the junction of the resistor 42 and diode 43 through a diode 45 and a pair of resistors 46, 47 in series, the resistors 46 and 47 being bridged by a capacitor 48. The junction of the resistor 47 and diode 43 is connected through a resistor 49 to the base of a p-n-p transistor 51, the base of which is also connected through a diode 41 to the emitter of the transistor 28. The emitter and collector of the transistor 51 are connected respectively to the collectors of a p-n-p transistor 50 and an n-p-n transistor 52, the transistors 50 and 52 having their emitters connected to the lines 14 and 15 respectively. The base of the transistor 50 is connected to the base of a p-n-p transistor 55 having its emitter connected to the line 14, its base and collector interconnected and its collector connected to the line 15 through a resistor 56, whilst the base of the transistor 52 is connected to the base of an n-p-n transistor 54 having its emitter connected to the line 15, its base and collector interconnected and its collector connected to the collector of a p-n-p transistor 53. The transistor 53 has its emitter connected to the emitter of the transistor 51 and its base connected to the junction of the resistors 46 and 47.

The collector of the tansistor 52 is further connected to the base of an n-p-n transistor 57, the emitter of which is connected to the line 15 and the collector of which is connected through a resistor 58 to the line 14, and also to the base of an n-p-n transistor 59, the emitter of which is connected to the base of an n-p-n transistor 60 having its emitter connected to the line 15. The collectors of the transistors 59 and 60 are connected to the line 14 through the primary winding 61 of an ignition coil having its secondary winding 62 connected to the spark plugs of the engine in turn to a distributor in conventional manner.

The circuit controls the production of sparks, and for this purpose there is an engine-driven member movable between the diode 25 and the transistor 27, the arrangement being such that at the instant when a spark is required, the transistor 27 is cut off from the light source. Ignoring for the moment the transistors 23 and 24, current flows through the diode 25 so that it permanently emits light. When the transistor 27 is illuminated, it produces an output which is applied by way of the diode 41 to the base of the transistor 51, and is also applied by way of the diode 45 to the capacitor 48 so the capacitor 48 is charged to the peak output of the transistor 28. A proportion (typically 90%) of the voltage across the capacitor 48 is applied to the base of the transistor 53. The transistors 50 and 55 act as current mirror circuit, that is to say the circuit trys to equilise the currents in the transistors 50 and 55. The transistors 52 and 54 act in similar fashion. However, while the transistor 27 is illuminated, the signal at the base of the transistor 51 will be more positive than the signal at the base of the transistor 53, because the transistor 53 only receives a proportion of the peak output of the transistor 27. The transistor 54 will, therefore, conduct more heavily than the transistor 52, and the transistor 52 will be saturated. Since the transistor 52 is saturated, its collector potential is low and the transistor 57 is off, so that the Darlington pair 59, 60 is on and current flows in the winding 61.

When the transistor 27 is cut off from the diode 25, the potential at the base of the transistor 51 falls, but the potential at the base of the transistor 53 remains substantially constant, because the peak output of the transistor 27 is trapped by the diode 45 and capacitor 48. The input at the base of the transistor 51 falls to the potential at the base of the transistor 53, which is a set proportion of the voltage across the capacitor 48, and the transistor 52 then conducts increasingly and comes out of saturation so that its collector potential rises and the transistor 57 is turned on. The transistors 59 and 60 are turned off to produce the spark. It will be appreciated that using this arrangement, the timing of the sparks will not be altered by any reduction in the efficiency of the diode 25 or the transistor 27, because the peak level circuit continuously measures the maximum output of the transistor 27, and always produces a spark at the instant when the output falls to a predetermined proportion of the maximum output.

The transistors 23 and 24 are controlled by the switching circuit 22, 18, and provided that the output across the capacitor 48 is above a predetermined level, then the transistor 21 is on and turns on the transistors 23 and 24 so that part of the current flowing through the resistor 26 flows through the transistor 24. However, when the efficiency of the diode 25 or the transistor 27 reduces to a point at which the voltage across the capacitor 48 is below a set level, then the transistor 18 turns on, and the transistors 23 and 24 turn off, so that the current flowing through the diode 25 is increased.

It will be appreciated that using the arrangement described, there will be very little alteration in the timing of the system as the components get older or dirtier.

The arrangement can also be used for other purposes, including control of injection of fuel.

Referring now to FIG. 2, in which components equivalent to those in FIG. 1 are indicated by the same reference numerals, the resistors 16, 17 in FIG. 1 are now omitted, and the base of the transistor 18 is connected to the collector of an n-p-n transistor 108 having its emitter connected to the line 15 and its base connected to the collector of an n-p-n transistor 106, the emitter of which is connected through a resistor 107 to the line 15. The base of the transistor 106 is connected to the base and collector of an n-p-n transistor 102 having its emitter connected to the line 15, and is also connected through a resistor 101 to the emitter of an n-p-n transistor 104. The emitter of the transistor 104 is connected through a resistor 105 to the collector of the transistor 106, and the base and collector of the transistor 104 are interconnected, and connected to the base of the transistor 18, and through a resistor 103 to the line 14. The resistors 19 and 22 are returned to the line 15 through a resistor 109.

There is now a diode 110 in series with the light emitting diode 25. The diodes 34 and 35 have now been omitted.

The arrangement of FIG. 1 in which the output from the transistor 27 is fed to the transistor 28, which provides two outputs through diodes 41 and 45 respectively, has now been altered. The components 41, 42, 43, 44 and 49 are omitted, and the emitter of the transistor 27 is now connected to the bases of a pair of n-p-n transistors 111 and 112, the collector of which are connected to the line 14. The emitters of the transistors 111, 112 are connected to the bases of a pair of n-p-n transistors 113, 115, and collectors of which are connected to the line 14. The emitter of the transistor 112 is connected to the line 15 through the capacitor 48, and also provides the required feedback to the base of the transistor 21. The emitter of the transistor 113 is connected to the base of the transistor 51, and the emitter of the transistor 115 is connected to the line 15 through the resistors 46 and 47 in series, the junction of the resistors 46, 47 being connected to the base of the transistor 53. The collector of the transistor 52 is connected to the base of the transistor 57, the remainder of the circuit being as shown in the original application.

The components 101 to 108 inclusive, which replace the resistor 16 and 17, form a temperature-stable voltage reference circuit, the reference voltage appearing at the collector of the transistor 108. Suitable choice of the resistors 101, 105 and 107 enables the collector current in the transistor 102 to be set at 10 times the collector current in the transistor 106. Under these conditions, the difference in the base-emitter voltage drop between the two transistors is predictable, and has a known positive temperature co-efficient. This voltage difference is applied to the resistor 107, which determines the current in the collector circuit of the transistor 106, and therefore the voltage produced across the resistor 105. The output voltage is made up of two components, namely the voltage across the resistor 105 and the base-emitter voltages of the transistors 108 and 104. As explained above, the voltage across the resistor 105 has a positive temperature co-efficient, whilst the base-emitter voltages both have negative temperature co-efficients. Thus, the total output voltage from the voltage reference circuit is temperature compensated, and is also approximately independent of supply voltage. Application of this reference voltage to the base of the transistor 18 produces a more accurate circuit than that shown in FIG. 1.

The purpose of the additional diode 110 is to permit a wider range of control of the diode current by the feedback circuit and the by-pass transistor 24.

The output stage from the transistor 27 operates in much the same way as in FIG. 1, but the arrangement shown in FIG. 2 facilitates integration of the circuit. The transistor 112 acts as an emitter follower to isolate the resistor 31 from the capacitor 48, and the transistor 115 serves a similar function for the resistors 46, 47. The transistors 111 and 113 are incorporated to compensate for the voltage drops produced by the transistors 112 and 115.

FIG. 3 shows a minor modification which is applicable to the arrangement of FIG. 1 or the arrangement of FIG. 2. The transistor 57 now has its collector connected through a resistor 71 to the base of an n-p-n transistor 72 with its emitter connected to the line 15 and its collector connected through a resistor 73 to the line 14. The base of the transistor 59 is now connected to the collector of the transistor 72. The only difference is that the transistor 72 inverts the output, so that whereas in FIG. 1 and FIG. 2 conduction of the transistor 57 results in non-conduction of the transistors 59 and 60, in FIG. 3 conduction of the transistor 57 results in non-conduction of the transistor 72, which in turn results in conduction of the transistors 59 and 60. If it is desired to produce a spark when the transistor 27 is cut off from the light source, then the arrangement of FIG. 1 or FIG. 2 is used, but if it is desired to produce a spark when the transistor 27 is exposed to the light source, then the minor modification shown in FIG. 3 is employed.

We claim:

1. A radiation-sensitive switching circuit comprising in combination a radiation source having a current input means for establishing a current flow through the source, a radiation-sensitive device which conducts when exposed to the radiation source, a control member positioned between the source and the device and serving to expose the device to the source at predetermined instants of time, a trigger circuit coupled to the device and producing an output when the output from the device attains a set level, and a transistor means connected in parallel with said radiation-sensitive device for modifying the current flow through the source, and sensing means connected to sense the output of the device and connected to control said transistor means in accordance with the output from the device with respect to a known level of illumination.

2. A circuit as claimed in claim 1 in which said sensing means measures the peak output of the device, and increases the current flow through the source when the peak output falls below a set level.

3. A circuit as claimed in claim 1 wherein said sensing means includes a switching circuit which compares the peak output of said device with a reference signal and changes from a first state to a second state when said peak output falls below a set level, the transistor being turned on when the switching circuit is in its first state but turned off when the switching circuit is driven to its second state.

4. A circuit as claimed in claim 3 in which said reference is provided by a temperature stable voltage reference circuit.

* * * * *